United States Patent
Park et al.

(10) Patent No.: US 11,474,012 B2
(45) Date of Patent: Oct. 18, 2022

(54) METHOD FOR PREPARING SILICON CARBIDE WAFER AND SILICON CARBIDE WAFER

(71) Applicant: SENIC INC., Cheonan-si (KR)

(72) Inventors: Jong Hwi Park, Suwon-si (KR); Jongmin Shim, Hwaseong-si (KR); Eun Su Yang, Suwon-si (KR); Yeon Sik Lee, Suwon-si (KR); Byung Kyu Jang, Suwon-si (KR); Jung Woo Choi, Suwon-si (KR); Sang Ki Ko, Suwon-si (KR); Kap-Ryeol Ku, Suwon-si (KR); Jung-Gyu Kim, Suwon-si (KR)

(73) Assignee: SENIC INC., Cheonan-si (KR)

( * ) Notice: Subject to any disclaimer, the term of this patent is extended or adjusted under 35 U.S.C. 154(b) by 369 days.

(21) Appl. No.: 16/915,621

(22) Filed: Jun. 29, 2020

(65) Prior Publication Data
US 2021/0123843 A1    Apr. 29, 2021

(30) Foreign Application Priority Data

Oct. 29, 2019  (KR) .................. 10-2019-0135384

(51) Int. Cl.
| | |
|---|---|
| *C30B 29/36* | (2006.01) |
| *G01N 3/303* | (2006.01) |
| *B24B 9/06* | (2006.01) |
| *B28D 5/00* | (2006.01) |
| *C30B 23/00* | (2006.01) |

(Continued)

(52) U.S. Cl.
CPC .............. *G01N 3/303* (2013.01); *B24B 9/065* (2013.01); *B28D 5/00* (2013.01); *C30B 23/002* (2013.01); *C30B 23/02* (2013.01); *C30B 29/36* (2013.01); *G01N 2203/0039* (2013.01); *G01N 2203/0064* (2013.01); *G01N 2203/0098* (2013.01); *H01L 29/1608* (2013.01)

(58) Field of Classification Search
CPC ................... C30B 29/36; C30B 23/00; H01L 21/02529; H01L 29/1608
See application file for complete search history.

(56) References Cited

U.S. PATENT DOCUMENTS 8,858,709 B1    10/2014  Zwieback et al.
10,822,720 B1 *  11/2020  Park .................. C30B 35/002

(Continued)

FOREIGN PATENT DOCUMENTS

| CN | 104246023 B | 2/2019 |
|---|---|---|
| CN | 109518276 A | 3/2019 |

(Continued)

*Primary Examiner* — Jaehwan Oh
(74) *Attorney, Agent, or Firm* — NSIP Law (57) ABSTRACT

A method for preparing a SiC ingot includes: disposing a raw material and a SiC seed crystal facing each other in a reactor having an internal space; subliming the raw material by controlling a temperature, a pressure, and an atmosphere of the internal space; growing the SiC ingot on the seed crystal; and collecting the SiC ingot after cooling the reactor. The wafer prepared from the ingot, which is prepared from the method, generates cracks when an impact is applied to a surface of the wafer, the impact is applied by an external impact source having mechanical energy, and a minimum value of the mechanical energy is 0.194 J to 0.475 J per unit area ($cm^2$).

20 Claims, 5 Drawing Sheets

(51) Int. Cl.
*C30B 23/02* (2006.01)
*H01L 29/16* (2006.01)

(56) References Cited

U.S. PATENT DOCUMENTS

| | | | | |
|---|---|---|---|---|
| 10,837,123 | B2* | 11/2020 | Fujikawa | ................ C30B 29/36 |
| 11,008,670 | B2* | 5/2021 | Fujikawa | ................ C30B 29/36 |
| 2009/0214799 | A1* | 8/2009 | Simard | ................ C01B 32/162 |
| | | | | 977/843 |
| 2013/0280466 | A1 | 10/2013 | Zwieback et al. | |
| 2014/0220296 | A1 | 8/2014 | Loboda et al. | |
| 2014/0220325 | A1* | 8/2014 | Loboda | ................ C30B 23/005 |
| | | | | 428/215 |
| 2016/0032486 | A1* | 2/2016 | Hansen | ................ C30B 33/10 |
| | | | | 117/109 |
| 2016/0097143 | A1* | 4/2016 | Rengarajan | ............. C23C 14/26 |
| | | | | 118/725 |
| 2016/0122901 | A1* | 5/2016 | Danno | ................... C30B 29/36 |
| | | | | 117/60 |
| 2017/0110748 | A1* | 4/2017 | Palumbo | ........... H01M 8/04753 |
| 2017/0342593 | A1* | 11/2017 | Sato | ........................ C30B 29/36 |
| 2018/0274125 | A1* | 9/2018 | Eto | ......................... C30B 23/06 |
| 2019/0194823 | A1* | 6/2019 | Fujikawa | .............. C30B 23/002 |
| 2019/0252504 | A1* | 8/2019 | Eto | ..................... H01L 29/1608 |
| 2020/0010974 | A1* | 1/2020 | Nakabayashi | ..... G01N 23/2076 |
| 2020/0071847 | A1* | 3/2020 | Vogel | ..................... C30B 29/36 |
| 2020/0080228 | A1* | 3/2020 | Hosaka | ................... C30B 23/00 |
| 2020/0263318 | A1* | 8/2020 | Ecker | .................... C23C 14/243 |

FOREIGN PATENT DOCUMENTS

| | | |
|---|---|---|
| EP | 3 228 733 A1 | 10/2017 |
| JP | 5-221796 A | 8/1993 |
| JP | 6-191998 A | 7/1994 |
| JP | 4585359 B2 | 11/2010 |
| JP | 2011-219296 A | 11/2011 |
| JP | 2012-136391 A | 7/2012 |
| JP | 2014-185055 A | 10/2014 |
| KR | 10-2010-0089103 A | 8/2010 |
| KR | 10-1227426 B1 | 1/2013 |
| KR | 10-2015-0115902 A | 10/2015 |
| KR | 10-2017-0076763 A | 7/2017 |
| TW | I333004 B | 11/2010 |
| WO | WO 2017/057742 A1 | 4/2017 |

* cited by examiner

METHOD FOR PREPARING SILICON CARBIDE WAFER AND SILICON CARBIDE WAFER

CROSS-REFERENCE TO RELATED APPLICATIONS

This application claims the benefit under 35 U.S.C. 119(a) of Korean Patent Application No. 10-2019-0135384 filed on Oct. 29, 2019, in the Korean Intellectual Property Office, the entire disclosure of which is incorporated herein by reference for all purposes.

BACKGROUND

1. Field

The present disclosure relates to a method for preparing a silicon carbide ingot, a method for preparing a silicon carbide wafer, a silicon carbide ingot, and a silicon carbide wafer.

2. Description of the Background

Silicon carbide (SiC) is a semiconductor with a wide band gap of 2.2 eV to 3.3 eV, and research and development has been progressing due to its excellent physical and chemical characteristics as a semiconductor material.

As methods for preparing a SiC single crystal, there are Liquid Phase Epitaxy (LPE), Chemical Vapor Deposition (CVD), Physical Vapor Transport (PVT), and the like. Among them, the PVT is a method of growing a SiC single crystal as follows: loads SiC raw materials into a crucible, places a seed crystal composed of a SiC single crystal on the top of the crucible, and then heats the crucible by an induction heating method to sublimate the raw materials such that the SiC single crystal grows on the seed crystal.

PVT is the most widely used process for a preparation of a SiC in the form of an ingot at high growth rate. However, a current density changes depending on characteristics of the crucible, processing conditions, etc., and the temperature distribution inside the crucible also changes, making it difficult to obtain stable properties of SiC ingots.

As a related technologies, there are "method for manufacturing silicon carbide single crystal and silicon carbide single crystal substrate" disclosed in Korean Patent Publication No. 10-2017-0076763, and "silicone carbide single crystal ingot, a substrate and an epitaxial wafer obtained therefrom" disclosed in Korean Patent Publication No. 10-2010-0089103.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for preparing a SiC ingot includes: disposing a raw material and a SiC seed crystal facing each other in a reactor having an internal space; subliming the raw material by controlling a temperature, a pressure, and an atmosphere of the internal space; growing the SiC ingot on the seed crystal; and collecting the SiC ingot after cooling the reactor.

The growing the SiC ingot may be performed in an inert gas atmosphere having a flow rate of 70 sccm to 330 sccm in the reactor.

The cooling the reactor may be performed in an inert gas atmosphere having a flow rate of 1 sccm to 300 sccm in the reactor.

A thermal conductivity of the reactor may be 120 W/mK or less.

The flow in the growing the SiC ingot or the cooling the reactor may be in a direction from the raw material to the silicon carbide seed crystal.

In another general aspect, a method for preparing a wafer includes: grinding an edge of the SiC ingot; and cutting the ground SiC ingot to prepare the wafer.

The SiC ingot may include two faces facing each other, wherein one of the two faces is defined as an upper portion having a flat or convex surface, and wherein the wafer is prepared from a portion below the upper portion.

The wafer may be a wafer, wherein when an impact is applied to a surface of the wafer, cracks are generated at the surface, wherein the impact is applied by an external impact source having mechanical energy, and wherein a minimum value of the mechanical energy is 0.194 J to 0.475 J per unit area ($cm^2$).

The wafer may be a wafer having a crack-generated drop height of 100 mm or more, wherein the crack-generated drop height is measured by a Dupont impact tester with the wafer having a thickness of 360 μm and a hammer having a weight of 25 g.

In another general aspect, the present disclosure provides a wafer, wherein when an impact is applied to a surface of the wafer, cracks are generated at the surface, wherein the impact is applied by an external impact source having mechanical energy, and wherein a minimum value of the mechanical energy is 0.194 J to 0.475 J per unit area ($cm^2$).

An area of the surface to which the impact is applied may be 100 $mm^2$ or less.

The minimum value of the mechanical energy may be 0.233 J to 0.475 J per unit area ($cm^2$).

The wafer may include a 4H-SiC structure and may have a diameter of 4 inches or more.

The impact may be applied by dropping the external impact source on the surface of the wafer at a predetermined height from the surface of the wafer.

In another general aspect, the present disclosure provides a wafer having a crack-generated drop height of 100 mm or more, wherein the crack-generated drop height is measured by a Dupont impact tester with the wafer having a thickness of 360 μm and a hammer having a weight of 25 g.

The crack-generated drop height may be measured by a Dupont impact tester with a concave die having a diameter of 4 mm.

The crack-generated drop height may be 150 mm or more.

The wafer may include a 4H-SiC structure and may have a diameter of 4 inches or more.

BRIEF DESCRIPTION OF THE DRAWINGS

The patent or application file contains a least one drawing executed in color. Copies of this patent or patent application publication with color drawing(s) will be provided by the Office upon request and payment of the necessary fee.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, the phrase that a certain element "comprises" or "includes" another element means that the certain element may further include one or more other elements but does not preclude the presence or addition of one or more other elements, unless stated to the contrary.

Throughout the specification, when an element is "connected" to another element, this includes not only 'directly connected' but also 'connected with another element in the middle'.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Throughout the specification, the term "combination of" included in Markush type description means mixture or combination of one or more elements described in Markush type and thereby means that the disclosure includes one or more elements selected from the Markush group.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

As used herein, the articles "a," "an," and "the" are intended to include the plural forms as well, unless the context clearly indicates otherwise.

As used herein, the term "and/or" includes any one and any combination of any two or more of the associated listed items; likewise, "at least one of" includes any one and any combination of any two or more of the associated listed items.

The present disclosure provides a method for preparing a silicon carbide ingot, a method for preparing a silicon carbide wafer, a silicon carbide ingot, and a silicon carbide wafer.

An impact resistance of an ingot or a wafer may vary depending on manufacturing conditions. Ingots or wafers with reduced impact resistance may be damaged or defective in during transportation, processing, treatment and the like. In addition, quality of an epitaxial layer may be deteriorated in a subsequent device manufacturing process due to a difference in the impact resistance.

While researching a method of manufacturing a SiC ingot with fewer defects and improved impact resistance, the inventors realized that, in growing SiC ingots by using a PVT method, among various factors, it is important to control the inert gas flow rate and the temperature gradient of the crucible, and confirmed that, by controlling these conditions, a SiC ingot with better quality can be produced.

SIC Ingot

Figure 2:
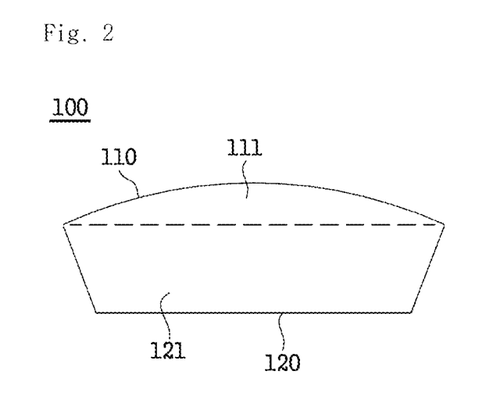
FIG. 2 is a conceptual view showing the shape of an ingot manufactured according to an embodiment.

Referring to FIG. 2, in one general aspect, the SiC ingot 100 includes a first surface 110 and a second surface 120 facing each other. The first surface 110, which is located away from the seed crystal and is defined as the upper portion, is a flat surface or a convex surface. A wafer is prepared at a portion below the first surface 110.

The wafer may be cracked by an impact applied to the surface.

The impact is caused by an external impact source, such as heavy hammer, having mechanical energy. When a crack occurs in the wafer, the minimum value of mechanical energy of the external impact source may be 0.194 J to 0.475 J per unit area ($cm^2$). In other words, the crack does not occur unless the external impact source having the minimum value of mechanical energy is applied to the surface of the wafer.

The SiC ingot 100 is grown by sublimating the raw material to be recrystallized on the SiC seed crystals inside the reactor.

Referring to FIG. 2, after the growth is completed, among the two surfaces 110 and 120 of the SiC ingot, the surface facing the raw material is the first surface 110, and the first surface 110 may have a curved convex surface or a flat surface.

The SiC ingot 100 may include a main body portion 121 and a convex portion 111 extending from the main body portion 121 and having a convex surface 110. When the convex surface 110 of the SIC ingot 100 is considered as an upper portion, a portion below the convex surface 110 may correspond to the main body portion 121.

When the first surface 110 of the SiC ingot 100 is considered as an upper portion, a bottom surface, which is a surface where the growth of the SiC ingot is started, may be referred to as the second surface 120, and the second surface 120 may be considered as a lower portion. The SiC wafer, so called bare wafer, may be prepared by cutting the portion below the first surface 110 of the SiC ingot into a predetermined thickness. The second surface 120 or the (0001) surface of the SiC ingot forms a predetermined off angle to the wafer by the cutting.

In the process of preparing the wafer, the outer diameter of the SiC ingot 100 is ground in a direction from the outer diameter to a center of the SiC ingot 100 by using a grinding equipment. And after cutting the SiC ingot 100 in a predetermined off angle with respect to the second surface 120 or (0001) surface of the SiC ingot 100 with a predetermined thickness, processing such as edge grinding, surface grinding and polishing, and the like may be performed.

The off angle of the wafer with respect to the second surface 120 or the (0001) surface of the SiC ingot 100 may be 0° to 10°.

The wafer, to which the off angle is applied to, may have a locking angle of −1.5° to 1.5° relative to a reference angle. The wafer, to which the off angle is applied to, may have a locking angle of −1.0° to 1.0° or −0.5° to 0.5° relative to a reference angle. The wafer, to which the off angle is applied to, may have a locking angle of −0.3° to 0.3° relative to a reference angle. The ingot having these characteristics may have excellent crystalline properties.

The locking angle is evaluated as follows: a direction of the wafer [11-20] is aligned with a X-ray path of a high resolution X-ray diffraction analysis system (HR-XRD system); setting angles of the X-ray source optic and the X-ray detector optic to 2θ (35 to 36 degrees); the rocking curve is determined by controlling an omega (ω, or theta θ, X-ray detector optic) angle to correspond to the off angle of the wafer; and the crystallinity is evaluated from the locking angle, which is obtained from a difference between the peak angle, which is a reference angle, and two full width at half maximum (FWHM).

In the present disclosure, an off angle of X degrees means that it has an off angle evaluated as X degrees within a general error range, and for example, it includes an off angle in a range of (X−0.05 degrees) to (X+0.05 degrees). In the present disclosure, the locking angle "−1 to +1 degree relative to the reference angle" means that the full width at half maximum is in the range of (peak angle−1 degree) to (peak angle+1 degree) with respect to the peak angle, which is the reference angle.

In addition, a surface excluding a center part and a part within 5 mm from an edge to the center is divided substantially equally into three parts, and an average value of three or more measurements in each part is determined as the locking angle. Specifically, of the wafers having an off angle of 0 degree to 10 degree with respect to the bottom surface 120 of the SiC ingot 100, the omega angle is 17.8111 degree when the off angle is 0 degree, the omega angle is 13.811 degree when the off angle is 4 degree, and the omega angle is 9.8111 degree when and the off angle is 8 degree.

The wafer prepared by cutting the SiC ingot 100 may be cracked by an impact applied to the surface. When the impact is applied to the surface by an external impact source, such as heavy hammer, having mechanical energy, the minimum value of the mechanical energy may be 0.194 J or more per unit area ($cm^2$), 0.233 J or more per unit area ($cm^2$), 0.467 J or more per unit area ($cm^2$), or 0.475 J or more per unit area ($cm^2$).

Wafers that do not crack even when impacted by an external impact source having such mechanical energy as defined above may minimize damage and defects during transportation, processing, and treatment of the wafer. They also may exhibit better quality in the process of forming a SiC epitaxial layer, a subsequent process for device manufacture.

The fact that a crack does not occur even when an impact is applied to the wafer means that the wafer, after the impact, is not divided into two or more, a crack having a width of 0.001 mm or more is not generated, and it is not broken into fragments.

The impact is caused by a collision between an external impact source (eg, a heavy hammer) having potential energy, kinetic energy or the like, and the surface of the wafer, and is evaluated as an impact amount. Impact resistance may be evaluated based on the mechanical energy of the impact source. Impact resistance may be evaluated as the kinetic energy of the impact source when the impact source impacts the surface of the wafer.

The area of the surface, where the impact is directly applied to, may be 100 $mm^2$ or less. The area of the surface, where the impact is directly applied to, may be 50 $mm^2$ or less, or may be 25 $mm^2$ or less. The area of the surface, where the impact is directly applied to, may be 10 $mm^2$ or more.

The wafer may not be cracked, when DuPont impact test is performed by dropping a heavy hammer having a weight of 25 g from a height of about 100 mm to 200 mm, onto a specimen having a thickness of about 360 μm placed on a concave die, at a temperature of about 25° C., according to ASTM D 2794. The concave die (impactor) may have a diameter of about 4 mm or less.

The wafer may not be cracked, when DuPont impact test is performed by dropping a heavy hammer having a weight of 30 g from a height of about 100 mm to 200 mm, onto a specimen having a thickness of about 360 μm placed on a concave die, at a temperature of about 25° C., according to ASTM D 2794. The concave die (impactor) may have a diameter of about 4 mm or less.

When a crack occurs in a wafer by applying an impact to the surface of the wafer, the impact can be quantified by the mechanical energy of the impact source.

The impact resistance may be evaluated as the maximum value of the impact that does not generate cracks, which may be evaluated as the maximum value of the mechanical energy of the impact source. In addition, the impact resistance may be evaluated as the minimum value of the impact that generates cracks, which may be evaluated as the minimum value of the mechanical energy of the impact source. These two values appear to be substantially similar values.

Since it is easier to evaluate the minimum value of the impact that generates cracks than the maximum value of the impact that does not generate cracks, in the present disclosure, the impact resistance of the wafer is evaluated based on the minimum value of the impact that generates cracks.

Impact resistance may be measured by a test of dropping a heavy hammer on the wafer. Specific details are described in the following experimental examples.

The wafer may have a micropipe (MP) density of 1.5/$cm^2$ or less, or 1/$cm^2$ or less.

The wafer may have a threading edge dislocation (TED) density of 10,000/cm² or less, or 8,000/cm² or less.

The wafer may have a basal plane dislocation (BPD) density of 5,000/cm² or less, or 3,000/cm² or less.

When the wafer satisfies the defect density range above, it may provide a high-quality wafer with few defects, and when it is applied to a device, a device having excellent electrical properties or optical properties can be manufactured.

The defect density of the wafer may be measured by adding an etching solution and imaging the surface. Specific details are described in the following experimental examples.

The thickness of the wafer may be 300 μm to 600 μm, but is not limited thereto, as long as it is an appropriate thickness applicable to a semiconductor device.

The SiC ingot 100 may be substantially a single crystal 4H-SiC structure with minimal defects and polymorphic mixing.

The SiC ingot 100 may have a diameter of 4 inches or more, 5 inches or more, further 6 inches or more. Specifically, the SiC ingot 100 may have a diameter of 4 inches to 12 inches, 4 inches to 10 inches or 4 inches to 8 inches. In the production of the SiC ingot 100, appropriate SiC seed crystals may be used depending on these characteristics.

The SiC ingot 100 may grow on the C plane (000-1 surface) of the SiC seed crystal.

The SiC ingot may be manufactured through a crucible that satisfies a flow rate control of the inert gas and a specific thermal conductivity in a growth step and a cooling step. Details will be described later.

Wafer

In one general aspect, the present disclosure provides a wafer, wherein when an impact is applied to a surface of the wafer, cracks are generated at the surface, wherein the impact is applied by an external impact source having mechanical energy, and wherein a minimum value of the mechanical energy is 0.194 J to 0.475 J per unit area (cm²).

The wafer may have crack-generated drop height of 100 mm or more, wherein the crack-generated drop height is measured by a Dupont impact tester with the wafer having a thickness of 360 μm and a hammer having a weight of 25 g.

The wafer may be prepared by cutting the SiC ingot 100 in the manner described herein.

The locking angle of the wafer is the same as described herein.

The wafer prepared by cutting the SiC ingot 100 may be cracked by an impact applied to the surface. When the impact is applied to the surface by an external impact source, such as heavy hammer, having mechanical energy, the minimum value of the mechanical energy may be 0.194 J or more per unit area (cm²), 0.233 J or more per unit area (cm²), 0.467 J or more per unit area (cm²), or 0.475 J or more per unit area (cm²).

Wafers that do not crack even when impacted by an external impact source having such mechanical energy as defined above may minimize damage and defects during transportation, processing, and treatment of the wafer. They also may exhibit better quality in the process of forming a SiC epitaxial layer, a subsequent process for device manufacture.

The fact that a crack does not occur even when an impact is applied to the wafer means that the wafer, after the impact, is not divided into two or more, a crack having a width of 0.001 mm or more is not generated, and it is not broken into fragments.

The impact is caused by a collision between an external impact source (eg, a heavy hammer) having potential energy, kinetic energy or the like, and the surface of the wafer, and is evaluated as an impact amount. Impact resistance may be evaluated based on the mechanical energy of the impact source. Impact resistance may be evaluated as the kinetic energy of the impact source when the impact source impacts the surface of the wafer.

The area of the surface, where the impact is directly applied to, may be 100 mm² or less. The area of the surface, where the impact is directly applied to, may be 50 mm² or less, or may be 25 mm² or less. The area of the surface, where the impact is directly applied to, may be 10 mm² or more.

The wafer may not be cracked, when DuPont impact test is performed by dropping a heavy hammer having a weight of 25 g from a height of about 100 mm to 200 mm, onto a specimen having a thickness of about 360 μm placed on a concave die, at a temperature of about 25° C., according to ASTM D 2794. The concave die (impactor) may have a diameter of about 4 mm or less.

The wafer may not be cracked, when DuPont impact test is performed by dropping a heavy hammer having a weight of 30 g from a height of about 100 mm to 200 mm, onto a specimen having a thickness of about 360 μm placed on a concave die, at a temperature of about 25° C., according to ASTM D 2794. The concave die (impactor) may have a diameter of about 4 mm or less.

When a crack occurs in a wafer by applying an impact to the surface of the wafer, the impact can be quantified by the mechanical energy of the impact source.

The impact resistance may be evaluated as the maximum value of the impact that does not generate cracks, which may be evaluated as the maximum value of the mechanical energy of the impact source. In addition, the impact resistance may be evaluated as the minimum value of the impact that generates cracks, which may be evaluated as the minimum value of the mechanical energy of the impact source. These two values appear to be substantially similar values.

Since it is easier to evaluate the minimum value of the impact that generates cracks than the maximum value of the impact that does not generate cracks, in the present disclosure, the impact resistance of the wafer is evaluated based on the minimum value of the impact that generates cracks.

Impact resistance may be measured by a test of dropping a heavy hammer on the wafer. Specific details are described in the following experimental examples.

The wafer may have a micropipe (MP) density of 1.5/cm² or less, or 1/cm² or less.

The wafer may have a threading edge dislocation (TED) density of 10,000/cm² or less, or 8,000/cm² or less.

The wafer may have a basal plane dislocation (BPD) density of 5,000/cm² or less, or 3,000/cm² or less.

The thickness of the wafer may be 300 μm to 600 μm, but is not limited thereto, as long as it is an appropriate thickness applicable to a semiconductor device.

The wafer may be a SiC wafer.

The wafer may be a 4H-SiC wafer that is substantially a single crystal.

The wafer may have a diameter of 4 inches or more, 5 inches or more, or 6 inches or more. The wafer may have a diameter of 12 inches or less, or 10 inches or less.

When the wafer satisfies the defect density range above, it may provide a high-quality wafer with few defects, and when it is applied to a device, a device having excellent electrical properties or optical properties can be manufactured.

The defect density of the wafer may be measured by adding an etching solution and imaging the surface. Specific details are described in the following experimental examples.

Method for Manufacturing the SiC Ingot

Figure 1:
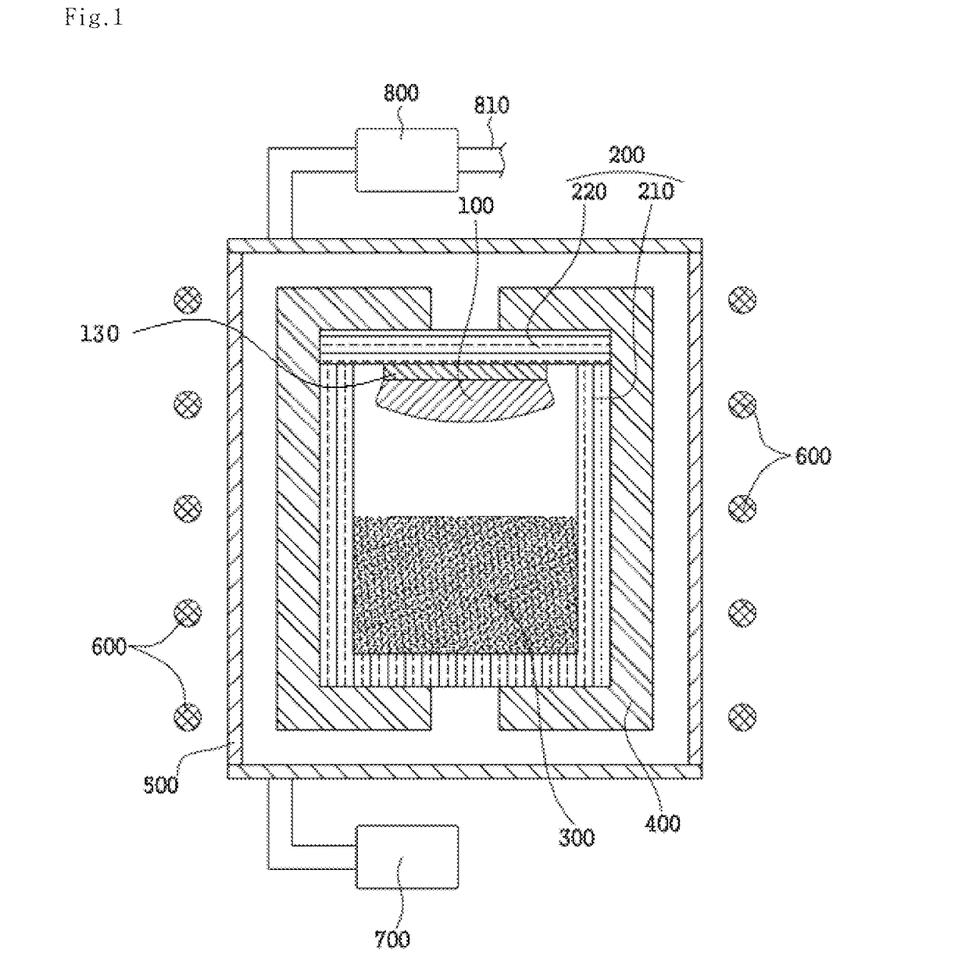
FIG. 1 is a conceptual view showing an example of a SiC ingot manufacturing apparatus according to an embodiment.

In one general aspect, a method for preparing a SiC ingot includes: disposing a raw material 300 and a SiC seed crystal 130 facing each other in a reactor 200 having an internal space; subliming the raw material by controlling a temperature, a pressure, and an atmosphere of the internal space; growing the SiC ingot 100 on the seed crystal 110; and collecting the SiC ingot 100 after cooling the reactor 200.

Referring to FIG. 2, the SiC ingot 100 includes the first surface 110 and the second surface 120 facing each other, wherein the first surface 110 defined as an upper portion is a flat surface or a convex surface, a wafer is prepared at a portion below the first surface 110.

In the wafer, when an impact is applied to a surface of the wafer, cracks may be generated at the surface, wherein the impact is applied by an external impact source such as a heavy hammer having mechanical energy, and wherein a minimum value of the mechanical energy may be 0.194 J to 0.475 J per unit area ($cm^2$).

The wafer may have crack-generated drop height of 100 mm or more, wherein the crack-generated drop height measured by a Dupont impact tester with the wafer having a thickness of 360 µm and a hammer having a weight of 25 g.

The method for preparing the SiC ingot according to an embodiment includes disposing the raw material 300 and the SiC seed crystals 130 facing each other in the reactor 200 having the internal space.

The characteristics of the SiC seed crystal 130 are the same as described herein.

The raw material 300 may be a powder form having a carbon source and a silicon source. The powder may be raw materials necked to each other or a SiC powder having a carbonized surface.

The reactor 200 may be suitable for growth reaction of a SiC ingot, and specifically, may be a graphite crucible. For example, the reactor 200 may include a main body 210 including an internal space and an opening, and a cover 220 corresponding to the opening to seal the internal space. The crucible cover 220 may further include a seed crystal holder integrally or separately from the crucible cover 220. Through the seed crystal holder, SiC seed crystal 130 can be fixed such that the raw material faces the SiC seed crystal 130.

The thermal conductivity of the reactor 200 may be 80 W/mK or more, 85 W/mK or more, or 90 W/mK or more. The thermal conductivity of the reactor 200 may be 120 W/mK or less. If the thermal conductivity of the reactor is less than 80 W/mK or greater than 120 W/mK, the temperature gradient in the reactor 200 becomes very large or small. As a result, the defect density value of the SiC ingot manufactured therefrom may be increased and impact resistance may be deteriorated. By the reactor 200 satisfying the thermal conductivity range above, a SiC ingot having excellent crystallinity and improved impact resistance may be manufactured.

The reactor 200 may be fixed by being surrounded by a heat insulating material 400. In the reaction chamber 500, such as a quartz tube, a heat insulating material 400 surrounding the reactor 200 may be disposed. The temperature of the internal space of the reactor 200 may be controlled by a heating means 600 provided outside the heat insulating material 400 and the reaction chamber 500.

The heat insulating material 400 may have an air porosity of 72% to 95%, 75% to 93%, 80% to 91%, or 80 to 85%. When the heat insulating material 400 satisfying the air porosity above is used, crack generation of the resulting SiC ingot may be further reduced.

The heat insulating material 400 may have a compressive strength of 0.2 Mpa or more, 0.48 Mpa or more, or 0.8 MPa or more. In addition, the heat insulating material 400 may have a compressive strength of 3 MPa or less, or 2.5 MPa or less. When the heat insulating material 400 has such compressive strength, it is excellent in thermal/mechanical stability, and the probability of occurrence of ash is low, so that a SiC ingot with better quality may be manufactured.

The heat insulating material 400 may include a carbon-based felt, specifically a graphite felt, a rayon-based graphite felt, or a pitch-based graphite felt.

The reaction chamber 500 may include a vacuum exhauster 700 connected to the inside of the reaction chamber 500 and adjusting the degree of vacuum inside the reaction chamber 500, a plumbing 810 connected to the inside of the reaction chamber 500 and introducing gas into the inside of the reaction chamber 500, and a mass flow controller 800 to control controlling the flow of the mass. Through these configurations, it is possible to control the flow rate of the inert gas in a subsequent growing and cooling steps.

In the method for preparing a SiC ingot according to an embodiment, through sublimating the raw material by adjusting the temperature, pressure, and gas atmosphere of the internal space, the SiC ingot 100 may be grown on the seed crystal 130.

The sublimation of the raw material may be performed by heating the reactor 200 and the internal space of the reactor by the heating means 600. The internal space is depressurized simultaneously with or separately from the heating to adjust the vacuum level, and the SiC ingot 100 may be grown by injecting an inert gas.

During the sublimation of the raw material, a temperature of the internal space may be controlled in a range of 2000° C. to 2600° C. and a pressure of the internal space may be controlled in a range of 1 torr to 200 torr. The SiC ingot 100 may be more efficiently produced in the temperature and pressure range above.

Specifically, the sublimation of the raw material, i.e., the growing of the SiC ingot 100 may be performed under the condition that the temperature of the surface of top and bottom the reactor 200 is 2100° C. to 2500° C., and the pressure of the internal space of the reactor 200 is 1 torr to 50 torr, more specifically, the temperature of the surface of top and bottom of the reactor 200 is 2150° C. to 2450° C., and the pressure of the internal space of the reactor 200 is 1 torr to 40 torr, and still more specifically, the temperature of the surface of top and bottom of the reactor 200 is 2150° C. to 2350° C., and the pressure of the internal space of the reactor 200 is 1 torr to 30 torr. When the temperature and pressure conditions are controlled with the range specified above, a higher quality SiC ingot may be produced.

The temperature may be increased up to the temperature range above at a temperature increase rate of 1° C./min to 10° C./min or 5° C./min to 10° C./min.

During the growing step, an inert gas having a predetermined flow rate may be added to the outside of the reactor 200. The inert gas may be flown into the internal space of the reactor 200 and in the direction from the raw material 300 to the SiC seed crystal 130. Accordingly, a stable temperature gradient of the reactor 200 and the internal space thereof may be maintained.

The flow rate of the inert gas may be 70 sccm or more, 90 sccm or more, or 100 sccm or more. The flow rate of the inert gas may be 330 sccm or less, 300 sccm or less, or 280 sccm or less. If the flow rate of the inert gas is less than 70 sccm, the supply of the raw materials for the production of the SiC ingot 100 is not smooth, such that polymorphism and defects may increase. If the flow rate of the inert gas is more than 330 sccm, the defect density of the SiC ingot 100 and the wafer to be produced therefrom may increase, and the impact resistance of the wafer may deteriorate. When the flow rate of the inert gas is controlled with the range above, the temperature gradient of the crucible may be effectively formed, and the quality and impact resistance of the manufactured ingot may be improved.

The inert gas in the growth step may be, for example, argon, helium, and a mixture thereof.

In the method for preparing a SiC ingot according to an embodiment, the grown SiC ingot 100 may be cooled at a predetermined cooling rate and an inert gas flow rate condition.

The cooling may be performed at a rate of 1° C./min to 10° C./min or at a rate of 1° C./min to 5° C./min.

The pressure adjustment of the internal space of the reactor 200 may be performed simultaneously with or separately from the cooling. The pressure adjustment may be performed such that the pressure in the internal space is 760 torr at the maximum.

As in the above growth step, in the cooling step, an inert gas having a predetermined flow rate may be added to the outside of the reactor 200. The inert gas may be flown into the internal space of the reactor 200 and flown in the direction from the raw material 300 to the SiC seed crystal 130.

The flow rate of the inert gas in the cooling step may be 1 sccm or more, 50 sccm or more, or 100 sccm or more. The flow rate of the inert gas may be 300 sccm or less, 280 sccm or less, or 250 sccm or less. If the flow rate of the inert gas in the cooling step is less than 1 sccm, a large temperature gradient is formed during the cooling such that cracks may occur in the ingot being manufactured. If the flow rate of the inert gas in the cooling step is more than 300 sccm, cracks may occur in ingots being manufactured by rapid cooling. Within the flow rate range of the inert gas above, it is possible to minimize the deterioration of the quality of the ingot during cooling and to secure good impact resistance.

The growth of the SiC ingot may be different depending on the size and type of the reactor 200 and the condition of the raw material. The quality of the SiC ingot may also change depending on the temperature gradient, pressure, gas flow rate, etc. of the internal space of the reactor during the growth step or the cooling step. In an embodiment, an optimum flow rate of inert gas and thermal conductivity of the crucible are adopted to manufacture a SiC ingot with excellent quality.

The characteristics of the SiC ingot manufactured by the manufacturing method for SiC ingot are the same as described herein.

Method for Manufacturing the Wafer

In one general aspect, a method for preparing a wafer includes: grinding an edge of the SiC ingot 100; and cutting the ground SiC ingot to prepare the wafer.

The grinding of an edge of the SiC ingot 100 may be performed from the maximum external diameter of the SiC ingot 100 to a center of the SiC ingot 100 such that more than 5% of a cross-sectional area of the SiC ingot is ground.

The grinding step may be performed to have a uniform cross section in the direction from the edge of the first surface 110 to the second surface 120, and in the direction to the central axis of the SiC ingot 100.

The cutting may be performed to have a predetermined off angle with the second surface 120 or the (0001) surface of the SiC ingot 100.

The off angle of the cutting is the same as described herein.

The cutting may be performed such that the thickness of the wafer is 300 μm to 600 μm, but is not limited thereto.

The method for preparing the wafer may further include planarizing the thickness of the wafer provided after the cutting.

The method for preparing the wafer may further include grinding the edge of the wafer provided after the cutting.

The method for preparing the wafer may further include etching and polishing the surface of the wafer provided after the cutting.

The planarizing, the grinding, and the etching and polishing may be performed in the order of planarizing-grinding-etching and polishing.

The characteristics of the wafer prepared by the above method are the same as described herein.

Hereinafter, while embodiments of the present disclosure will be described in more detail with reference to the accompanying examples, it should be noted that examples are not limited to the following.

1. Growth of the SiC Ingot

As shown in FIG. 1, in the device for manufacturing the SiC ingot, the SiC powder as raw material was disposed at the bottom of internal space of the reactor, and the SiC seed crystal was disposed at the top of the reactor. The SiC seed crystal made of 6 inch 4H-SiC crystal was used, and the C plane (000-1 plane) was fixed to face the SiC raw material disposed at the bottom of internal space. The same applies to the following examples and comparative examples.

After the reactor was sealed and the outside thereof was surrounded by the heat insulating material, the reactor was disposed in the quartz tube provided with a heating coil, which is the heating means. The internal space of the reactor was depressurized to adjust to a vacuum atmosphere, and argon gas was injected to the internal space to reach at 760 torr, and then the internal space was depressurized again. At the same time, the temperature of the internal space was raised to 2300° C. at a rate of 5° C./min. Using the pipe and the vacuum exhauster connected with the quartz tube, the flow rate of argon gas inside the quartz tube was adjusted to the flow rate values listed in Table 1. The SiC ingot was grown on SiC seed crystal facing the SiC raw material for 100 hours under a temperature of 2300° C. and a pressure of 20 torr.

After the growth, the temperature of the internal space was cooled to 25° C. at a rate of 5° C./min, and the pressure of the internal space was set to 760 torr. Using the pipe and the vacuum exhauster connected with the quartz tube, the flow rate of argon gas inside the quartz tube was adjusted to the flow rate values listed in Table 1.

2. Manufacture of the Wafer

The outer circumferential surface of the cooled SiC ingot is ground in an amount of 5% of the maximum external diameter and was processed into a cylindrical shape having a uniform external diameter. The SiC ingot was cut to have an off angle of 4° with respect to the (0001) surface of the SiC ingot, and then wafer samples with a thickness of 360 μm were prepared.

3. Measurement of Defect Density of the Wafer

Figure 4:
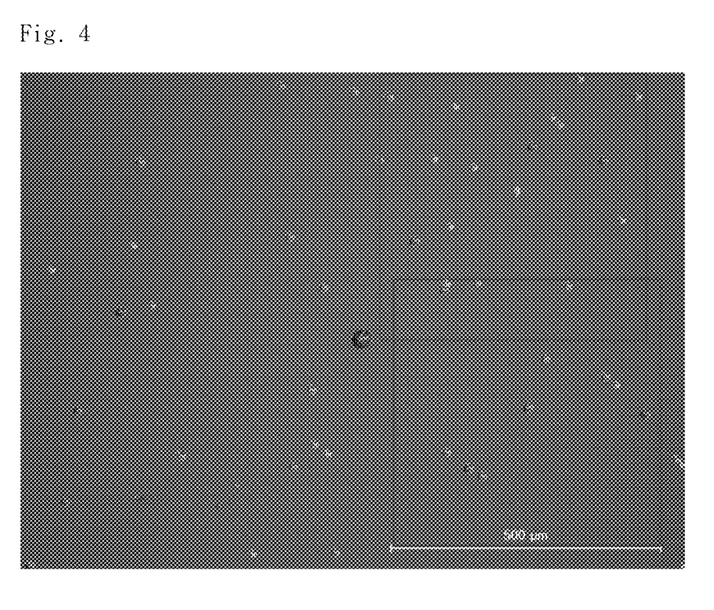
FIG. 4 is a photograph of the surface of the wafer sample by an optical microscope after potassium hydroxide etching in the experimental example.

The wafer sample was cut to a size of 50 mm×50 mm and etched by dipping in molten potassium hydroxide (KOH) at 500° C. for 5 minutes. Then, the defects on the surface of the wafer sample were imaged by an optical microscope (FIG. 4). The clam-like pit was classified as a basal plane dislocation (BPD), a small hexagonal pit was classified as a threading edge dislocation (TED), and a black giant hexagonal pit was classified as a micropipe (MP).

500 μm×500 μm region in the cut wafer sample was randomly designated 12 times, and the number of defects in each region was determined. Defect density was obtained by calculating the average number of defects per unit area, and the results are shown in Table 1.

4. Measurement of Impact Resistance of the Wafer

Figure 3A:
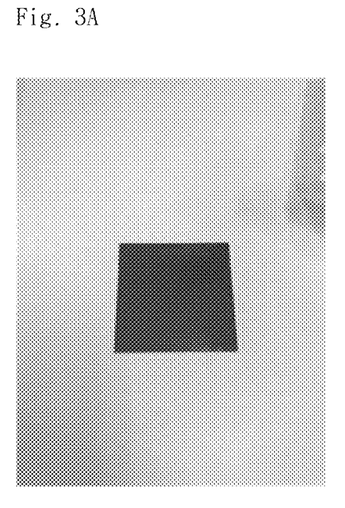
FIG. 3A is a photograph of wafer samples.
Figure 3B:
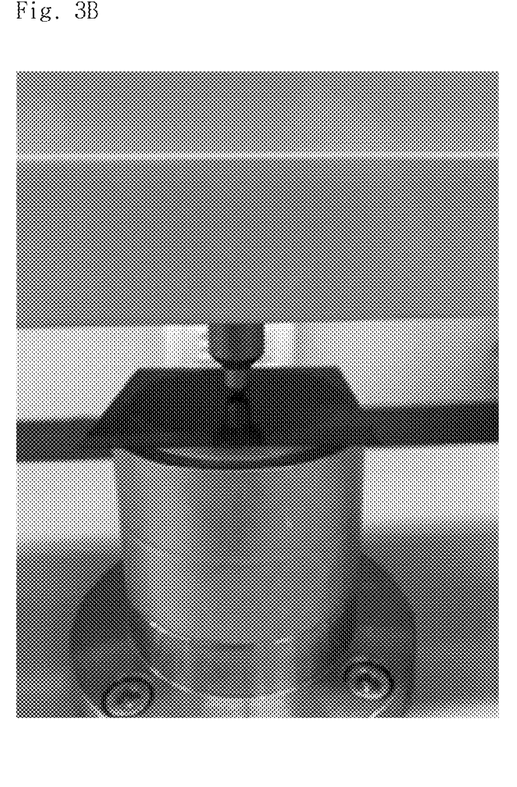
FIG. 3B is a photograph of an arrangement of a wafer sample in a measuring instrument.

The prepared wafer sample was cut to a size of 50 mm×50 mm (FIG. 3A). In accordance with ASTM D 2794, the experiment was conducted in an atmosphere of 25° C. by a Du Pont Impact Tester. As shown in FIG. 3B, a concave die with a diameter of 4 mm with a part, where the impact is applied, is flat was disposed in the center of one surface of the wafer sample and a receiver was disposed on the other surface of the wafer sample. The experiment was performed by dropping a heavy hammer and applying an impact to the concave die and the wafer sample under the conditions as shown in Tables 2 and 3. The mechanical energy of the heavy hammer and the mechanical energy applied to the wafer were calculated by Equation 1 below.

Figure 3C:
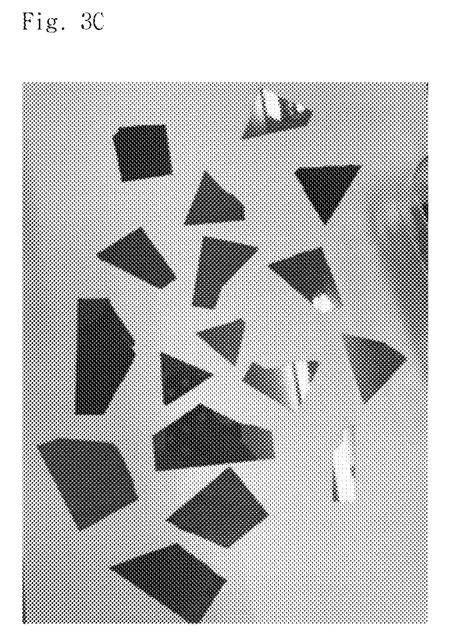
FIG. 3C is a photograph of cracked wafer samples.
Figure 3D:
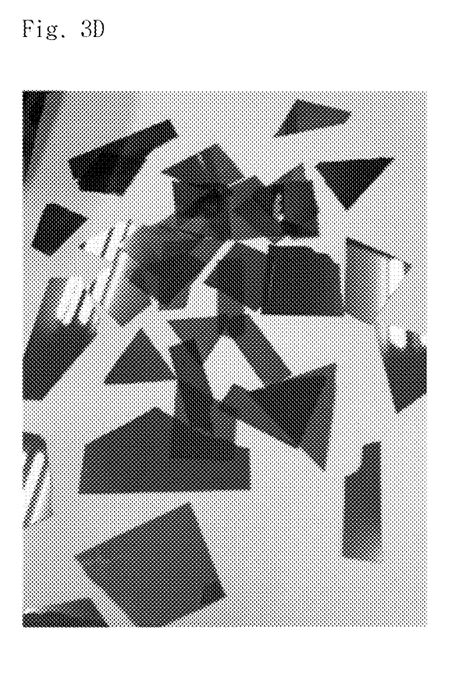
FIG. 3D is a photograph of cracked wafer samples used in an impact resistance test including dropping a heavy hammer according to an experimental example.

After the experiment, the state of the surface of the wafer was visually determined through an optical microscope. When the wafer was divided into two or more, cracks having a width of 0.001 mm or more were generated, or the wafer was broken into fragments as shown in FIGS. 3C and 3D, its was considered as cracks being generated.

$$Em = mgh + \tfrac{1}{2}mv^2 \quad \text{[Equation 1]}$$

(where Em is the mechanical energy, m is the weight of the heavy hammer (kg), g is the acceleration of gravity (9.8 m/s$^2$), h is the distance from the heavy hammer to the concave die (m), v is the speed of the heavy hammer (m/s).)

TABLE 1

|  | Growth step Ar flow rate (sccm) | Cooling step Ar flow rate (sccm) | Crucible thermal conductivity (W/mK) | MP (number/cm$^2$) | TED (number/cm$^2$) | BPD (number/cm$^2$) |
|---|---|---|---|---|---|---|
| Example 1 | 200 | 200 | 95 | 1 | 7920 | 3000 |
| Example 2 | 250 | 200 | 95 | 1 | 7980 | 2920 |
| Example 3 | 150 | 150 | 120 | 1 | 7880 | 2880 |
| comparative example 1 | 200 | 200 | 125 | 1 | 10480 | 3680 |
| comparative example 2 | 50 | 50 | 100 | 1.5 | 12880 | 8840 |
| comparative example 3 | 350 | 200 | 90 | 1 | 11800 | 9840 |

MP: micropipe,
TED: threading edge dislocation,
BPD: basal plane dislocation

TABLE 2

| Heavy hammer height | Heavy hammer: 25 g, Diameter of concave die: 4 mm, Area of concave die: 12.6 mm$^2$ | | | | |
|---|---|---|---|---|---|
| Mechanical energy | 50 mm | 100 mm | 150 mm | 200 mm | 250 mm |
| Mechanical energy | 0.0123 J | 0.0245 J | 0.0368 J | 0.0490 J | 0.0612 J |
| per cm$^2$ | 0.098 J/cm$^2$ | 0.194 J/cm$^2$ | 0.291 J/cm$^2$ | 0.389 J/cm$^2$ | 0.486 J/cm$^2$ |
| Example 1 | ○ | ○ | X | — | — |
| Example 2 | ○ | ○ | ○ | ○ | X |
| Example 3 | ○ | ○ | ○ | ○ | X |
| comparative example 1 | ○ | X | — | — | — |
| comparative example 2 | ○ | X | — | — | — |
| comparative example 3 | X | — | — | — | — |

X: Crack generation, ○: No crack, —: Untested

TABLE 3

| Heavy hammer height | Heavy hammer: 30 g, Diameter of concave die: 4 mm, Area of concave die: 12.6 mm$^2$ | | | | |
|---|---|---|---|---|---|
| Mechanical energy | 50 mm | 100 mm | 150 mm | 200 mm | 250 mm |
| Mechanical energy | 0.0147 J | 0.0294 J | 0.0441 J | 0.0588 J | 0.0735 J |
| per cm$^2$ | 0.117 J/cm$^2$ | 0.233 J/cm$^2$ | 0.350 J/cm$^2$ | 0.467 J/cm$^2$ | 0.583 J/cm$^2$ |
| Example 1 | ○ | ○ | X | — | — |
| Example 2 | ○ | ○ | ○ | ○ | X |
| Example 3 | ○ | ○ | ○ | ○ | X |
| comparative example 1 | ○ | X | — | — | — |

TABLE 3-continued

| Heavy hammer height | Heavy hammer: 30 g, Diameter of concave die: 4 mm, Area of concave die: 12.6 mm² | | | | |
|---|---|---|---|---|---|
| Mechanical energy | 50 mm | 100 mm | 150 mm | 200 mm | 250 mm |
| Mechanical energy | 0.0147 J | 0.0294 J | 0.0441 J | 0.0588 J | 0.0735 J |
| per cm² | 0.117 J/cm² | 0.233 J/cm² | 0.350 J/cm² | 0.467 J/cm² | 0.583 J/cm² |
| comparative example 2 | ○ | X | — | — | — |
| comparative example 3 | X | — | — | — | — |

X: Crack generation, ○: No crack, —: Untested

Referring to Tables 1 to 3, in the growth of a SiC ingot, when the gas flow rate is 150-250 sccm in the growth step and 150-200 sccm in the cooling step, a micropipe density was 1/cm² or less, a threading edge dislocation density was 7920/cm² or less, and a basal plane dislocation density was 3000/cm².

In the above examples, it was confirmed that the minimum value of the mechanical energy at which cracks are generated on the surface was in the range of 0.233 J to 0.475 J per unit area (cm²). In comparative example 1, where the crucible thermal conductivity reached 125 W/mK, a threading edge dislocation density exceeded ten thousand per cm² such that the quality of the wafer was deteriorated. Also, the minimum value of the mechanical energy for cracking on the surface was less than 0.194 J per unit area (cm²). In comparative example 2, where the gas flow rate of the growth step was 50 sccm, a threading edge dislocation density reached 12880/cm², and a basal plane dislocation density reached 8840/cm² such that the quality of the wafer was further deteriorated. Also, as in comparative example 1, the minimum value of mechanical energy for cracking on the surface was less than 0.194 J per unit area (cm²). In comparative example 3, where the gas flow rate of the growth step was 350 sccm, a threading edge dislocation density was 11800/cm², a basal plane dislocation density was 9840/cm², and the minimum value of mechanical energy for cracking on the surface was less than 0.098 J per unit area (cm²), thus the quality and the impact resistance of the wafer were deteriorated.

Overall, in the growth of a SiC ingot, wafers of the examples satisfying conditions that the inert gas flow rate of the growth step is 70-330 sccm, the inert gas flow rate of the cooling step is 1-300 sccm, and the thermal conductivity of the crucible is 120 W/mK or less, showed good crystal quality and impact resistance.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for preparing a wafer, comprising:
disposing a raw material and a SiC seed crystal facing each other in a reactor having an internal space;
subliming the raw material by controlling a temperature, a pressure, and an atmosphere of the internal space;
growing the SiC ingot on the seed crystal;
collecting the SiC ingot after cooling the reactor;
grinding an edge of the SiC ingot; and
cutting the ground SiC ingot to prepare the wafer,
wherein a thermal conductivity of the reactor is 120 W/mK or less.

2. The method of claim 1, wherein the growing the SiC ingot on the seed crystal or the cooling the reactor is performed in an inert gas atmosphere having a flow in a direction from the raw material to the seed crystal.

3. The method of claim 2, wherein the growing the SiC ingot on the seed crystal is performed in the inert gas atmosphere having a flow rate of 70 sccm to 330 sccm.

4. The method of claim 2, wherein cooling the reactor is performed in the inert gas atmosphere having a flow rate of 1 sccm to 300 sccm.

5. The method of claim 3, wherein the temperature of the internal space is increased at a temperature increase rate of 1° C./min to 10° C./min.

6. The method of claim 4, wherein the cooling the reactor is performed at a cooling rate of 1° C./min to 10° C./min.

7. A wafer prepared from the method of claim 1,
wherein when an impact is applied to a surface of the wafer, cracks are generated at the surface,
wherein the impact is applied by an external impact source having mechanical energy, and
wherein a minimum value of the mechanical energy is 0.194 J to 0.475 J per unit area (cm²).

8. The wafer of claim 7, wherein an area of the surface to which the impact is applied is 100 mm² or less.

9. The wafer of claim 7, wherein the minimum value of the mechanical energy is 0.233 J to 0.475 J per unit area (cm²).

10. The wafer of claim 7, wherein the wafer comprises a 4H-SiC structure and has a diameter of 4 inches or more.

11. The wafer of claim 7, wherein the impact is applied by dropping the external impact source on the surface of the wafer at a predetermined height from the surface of the wafer.

12. The wafer of claim 7, wherein the wafer has a micropipe (MP) density of 1.5/cm² or less.

13. The wafer of claim 7, wherein the wafer has a threading edge dislocation (TED) density of 10,000/cm² or less.

14. The wafer of claim 7, wherein the wafer has basal plane dislocation (BPD) density of 5,000/cm$^2$ or less.

15. The wafer of claim 7, wherein the thickness of the wafer is 300 μm to 600 μm.

16. The wafer of claim 7, wherein the wafer is substantially a single crystal 4H-SiC structure.

17. A wafer prepared from the method of claim 1,
wherein the wafer has a crack-generated drop height of 100 mm or more, and
wherein the crack-generated drop height is measured by a Dupont impact tester with the wafer having a thickness of 360 μm and a hammer having a weight of 25 g.

18. The wafer of claim 17, wherein the crack-generated drop height is measured by the Dupont impact tester with a concave die having a diameter of 4 mm.

19. The wafer of claim 17, wherein the crack-generated drop height is 150 mm or more.

20. The wafer of claim 17, wherein the wafer comprises a 4H-SiC structure and has a diameter of 4 inches or more.

* * * * *